United States Patent
Lee et al.

(10) Patent No.: US 10,186,640 B2
(45) Date of Patent: Jan. 22, 2019

(54) LIGHT EMITTING DIODE AND LIGHT EMITTING DIODE ARRAY COMPRISING SAME

(71) Applicant: LG INNOTEK CO., LTD., Seoul (KR)

(72) Inventors: Keon Hwa Lee, Seoul (KR); Byeong Kyun Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/532,349

(22) PCT Filed: Dec. 24, 2015

(86) PCT No.: PCT/KR2015/014236
§ 371 (c)(1),
(2) Date: Jun. 1, 2017

(87) PCT Pub. No.: WO2016/105146
PCT Pub. Date: Jun. 30, 2016

(65) Prior Publication Data
US 2017/0338380 A1    Nov. 23, 2017

(30) Foreign Application Priority Data
Dec. 24, 2014  (KR) .......... 10-2014-0187884

(51) Int. Cl.
*H01L 33/46*  (2010.01)
*H01L 33/00*  (2010.01)
(Continued)

(52) U.S. Cl.
CPC .......... *H01L 33/46* (2013.01); *H01L 25/0753* (2013.01); *H01L 33/0079* (2013.01);
(Continued)

(58) Field of Classification Search
CPC .............................. H01L 33/46; H01L 33/385
See application file for complete search history.

(56) References Cited

U.S. PATENT DOCUMENTS 8,384,114 B2  2/2013  Tischler et al.
8,834,114 B2  9/2014  Sterantino et al.
(Continued)

FOREIGN PATENT DOCUMENTS

CN  101645482  2/2010
CN  103811597  5/2014
(Continued)

OTHER PUBLICATIONS

European Search Report dated Aug. 23, 2017 issued in Application No. 15873673.6.
(Continued)

*Primary Examiner* — Jay C Chang
*Assistant Examiner* — Mikka Liu
(74) *Attorney, Agent, or Firm* — KED & Associates, LLP

(57) ABSTRACT

Provided in one embodiment is a light emitting diode comprising: a light emitting structure including a first conductive semiconductor layer, an active layer on top of the first conductive semiconductor layer, and a second conductive semiconductor layer on top of the active layer; a first electrode arranged on a portion of the first conductive semiconductor layer; an insulating layer, which is arranged on a portion of the first electrode, the first conductive semiconductor layer, the active layer, and the second conductive semiconductor layer, and which has a DBR structure; and a second electrode arranged on the second conductive semiconductor layer, wherein the first electrode comes into contact with the insulating layer via a first surface and is exposed to the insulating layer via a second surface opposite the first surface.

19 Claims, 12 Drawing Sheets

(51) Int. Cl.
  *H01L 33/20* (2010.01)
  *H01L 33/38* (2010.01)
  *H01L 33/62* (2010.01)
  *H01L 25/075* (2006.01)
  *H01L 33/40* (2010.01)

(52) U.S. Cl.
  CPC ............ *H01L 33/20* (2013.01); *H01L 33/385* (2013.01); *H01L 33/405* (2013.01); *H01L 33/62* (2013.01); *H01L 2933/0016* (2013.01); *H01L 2933/0025* (2013.01); *H01L 2933/0066* (2013.01)

(56) References Cited

U.S. PATENT DOCUMENTS

| | | | |
|---|---|---|---|
| 2003/0231683 A1* | 12/2003 | Chua | B82Y 20/00 372/46.01 |
| 2010/0032701 A1 | 2/2010 | Fudeta | |
| 2012/0043574 A1* | 2/2012 | Lee | H01L 33/20 257/98 |
| 2012/0112220 A1* | 5/2012 | West | H01L 33/46 257/98 |
| 2013/0292718 A1 | 11/2013 | Chu et al. | |
| 2014/0091330 A1 | 4/2014 | Chen et al. | |
| 2016/0260869 A1* | 9/2016 | Jeon | H01L 33/38 |

FOREIGN PATENT DOCUMENTS

| | | |
|---|---|---|
| EP | 2 728 632 | 5/2014 |
| EP | 2 750 193 | 7/2014 |
| JP | 2014-157948 | 8/2014 |
| KR | 10-2012-0041646 | 5/2012 |
| KR | 10-2013-0063076 | 6/2013 |

OTHER PUBLICATIONS

International Search Report (with English Translation) and Written Opinion dated Apr. 12, 2016 issued in Application No. PCT/KR2015/014236.

Chinese Office Action dated Sep. 4, 2018 issued in Application No. 201580071060.5. (English Translation Attached).

* cited by examiner

⋮

LIGHT EMITTING DIODE AND LIGHT EMITTING DIODE ARRAY COMPRISING SAME

CROSS-REFERENCE TO RELATED PATENT APPLICATIONS

This application is a U.S. National Stage Application under 35 U.S.C. § 371 of PCT Application No. PCT/KR2015/014236, filed Dec. 24, 2015, which claims priority to Korean Patent Application No. 10-2014-0187884, filed Dec. 24, 2014, whose entire disclosures are hereby incorporated by reference.

TECHNICAL FIELD

Embodiments relate to a light emitting diode and a light emitting diode array including the same.

BACKGROUND ART

Group III-V compound semiconductors such as GaN and AlGaN are widely used in optoelectronics and for electronic devices by virtue of many advantages thereof, for example, a wide and easily adjustable band gap energy.

In particular, light emitting devices, such as light emitting diodes and laser diodes, which use a Group III-V or Group II-VI compound semiconductor material, are capable of rendering various colors, such as red, green, blue, and ultraviolet, by virtue of the development of thin-film growth technologies and device materials, are capable of producing white light at high efficiency using fluorescent materials or through color mixing, and have advantages such as low power consumption, semi-permanent lifespan, fast response speed, safety, and environmental friendliness as compared to conventional light sources, such as fluorescent lamps and incandescent lamps.

Therefore, such light emitting devices are increasingly applied to transmission modules of optical communication units, light emitting diode backlights as a replacement for cold cathode fluorescent lamps (CCFLs) constituting backlights of liquid crystal display (LCD) devices, lighting apparatuses using white light emitting diodes as a replacement for fluorescent lamps or incandescent lamps, headlights for vehicles, and traffic lights.

In a conventional light emitting device, a light emitting structure including an n-type semiconductor layer, an active layer and a p-type semiconductor layer is formed, and the conventional light emitting device emits light having energy determined by the intrinsic energy band of the material of the active layer when electrons injected into the active layer via the n-type semiconductor layer combine with holes injected into the active layer via the p-type semiconductor layer.

Attempts to form pixels while reducing the cross-sectional area of the light emitting structure have been made, but it is difficult to realize an ultrathin unit pixel because the thickness of each light emitting structure is too large.

That is, the above-mentioned light emitting structure is grown on a substrate formed of sapphire or the like; however, in a horizontal-type light emitting diode, in which a substrate is left as it is after growth of the light emitting structure, or in a vertical-type light emitting diode, in which a substrate is removed after a metal support is coupled to a portion of the light emitting structure, it is difficult to realize ultrathin pixels because the substrate or the metal support has a large thickness.

DISCLOSURE

Technical Problem

Embodiments provide an ultrathin light emitting diode from which a growth substrate or a metal support is omitted.

Technical Solution

In one embodiment, a light emitting diode includes a light emitting structure including a first conductive semiconductor layer, an active layer disposed on the first conductive semiconductor layer, and a second conductive semiconductor layer disposed on the active layer, a first electrode disposed on a portion of the first conductive semiconductor layer, an insulating layer disposed on the first electrode, the first conductive semiconductor layer, the active layer and a portion of the second conductive semiconductor layer, the insulating layer having a DBR structure, and a second electrode disposed on the second conductive semiconductor layer, wherein the first electrode includes a first surface and a second surface, the first surface being in contact with the insulating layer disposed thereon and the second surface being opposite the first surface and being exposed.

The light emitting structure may include a first mesa region, the first conductive semiconductor layer may include a second mesa region, and the first electrode may be disposed on the first conductive semiconductor layer in the second mesa region.

The first electrode may be disposed on a side surface of the first conductive semiconductor layer in the second mesa region.

The first electrode may extend to a periphery of the second mesa region.

An open region through which the second conductive semiconductor layer is exposed may be disposed on the first mesa region, and at least a portion of the second electrode may be disposed on the open region.

At least portions of the second conductive semiconductor layer, the insulating layer and the second electrode overlap each other in a periphery of the open region on the first mesa etching region.

The DBR structure may be formed such that arrangement of $TiO_2$ and $SiO_2$ or arrangement of $Ta_2O_5$ and $SiO_2$ is repeated at least twice.

The first electrode may include an ohmic layer, a reflective layer, and a coupling layer disposed on the reflective layer.

The coupling layer may include titanium (Ti).

The second electrode may include an ohmic layer and a reflective layer.

The ohmic layer of the second electrode may include chrome (Cr), silver (Ag) or titanium (Ti).

The ohmic layer of the second electrode may have a thickness of 1 nm or less.

The reflective layer may include an alloy of platinum (Pt) and gold (Au), an alloy of nickel (Ni) and gold (Au), an alloy of aluminum (Al), platinum (Au) and gold (Au), or an alloy of aluminum (Al), nickel (Ni) and gold (Au).

In another embodiment, a light emitting diode array includes a circuit board, a plurality of light emitting diodes, each including a light emitting structure disposed on the circuit board and including a first conductive semiconductor layer, an active layer disposed on the first conductive semiconductor layer, and a second conductive semiconductor layer disposed on the active layer, a first electrode disposed on a portion of the first conductive semiconductor layer, an insulating layer disposed on the first electrode, the first conductive semiconductor layer, the active layer and a portion of the second conductive semiconductor layer, the insulating layer having a DBR structure, and a second electrode disposed on the second conductive semiconductor layer, wherein the first electrode includes a first surface and a second surface, the first surface being in contact with the insulating layer disposed thereon and the second surface being opposite the first surface and being exposed, and an anisotropic conductive film (ACF) disposed between the circuit board and the light emitting diodes, wherein the ACF includes a base material and conductive balls provided in the base material, and the conductive balls are in contact with the circuit board and the second electrode.

The insulating layer may be disposed on the first surface of the first electrode, the first conductive semiconductor layer, the active layer and a portion of the second conductive semiconductor layer.

The second surface of the first electrode may be in contact with an upper surface and a side surface of the first conductive semiconductor layer in the second mesa region.

In a further embodiment, a light emitting diode array includes a circuit board, a plurality of light emitting diodes, each including a light emitting structure disposed on the circuit board and including a first conductive semiconductor layer, an active layer disposed on the first conductive semiconductor layer, and a second conductive semiconductor layer disposed on the active layer, a first electrode disposed on a portion of the first conductive semiconductor layer, an insulating layer disposed on the first electrode, the first conductive semiconductor layer, the active layer and a portion of the second conductive semiconductor layer, the insulating layer having a DBR structure, and a second electrode disposed on the second conductive semiconductor layer, wherein the first electrode includes a first surface and a second surface, the first surface being in contact with the insulating layer disposed thereon and the second surface being opposite the first surface and being exposed, and an anisotropic conductive film (ACF) disposed between the circuit board and the light emitting diodes, wherein the ACF includes a base material and conductive balls provided in the base material, and the conductive balls are in contact with the circuit board and the second electrode.

The first electrode of each of the light emitting diodes may be connected to first electrodes of other light emitting diodes using a single wiring structure in a region oriented opposite the circuit board.

Advantageous Effects

According to a light emitting diode and a light emitting diode array including the same according to the embodiment, an insulating layer having a DBR structure is disposed on an upper surface of a light emitting structure, on a portion of an upper surface of a second electrode and on an upper surface of a first electrode, whereby light emitted from an active layer may be reflected to a lower surface of the light emitting diode.

Further, by virtue of reflection of the insulating layer having a DBR structure, in addition to the first electrode and the second electrode, light emitting efficiency may be improved.

Furthermore, it is possible to prevent light leakage by forming the second electrode to be broader than an open region of a transmissive conductive layer in a process of forming the second electrode.

BEST MODE

Hereinafter, embodiments will be described detail with reference to the accompanying drawings.

It will be understood that when an element is referred to as being "on" or "under" another element, it can be directly on/under the element, or one or more intervening elements may also be present. When an element is referred to as being "on" or "under", "under the element" as well as "on the element" can be included based on the element.

Figure 1:
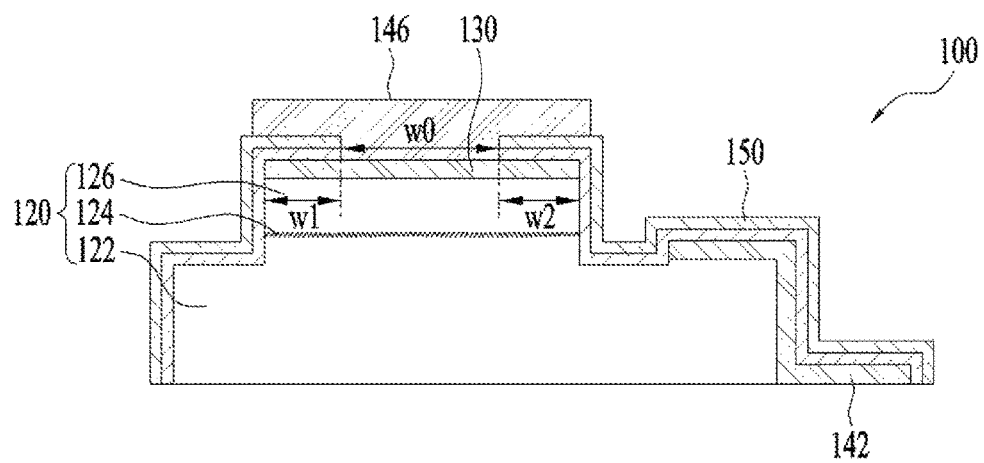
FIG. 1 is a sectional view of an embodiment of a light emitting diode.

FIG. 1 is a sectional view of an embodiment of a light emitting diode.

A light emitting diode 100 according to the embodiment includes a light emitting structure 120, which includes a first conductive semiconductor layer 122, an active layer 124 and a second conductive semiconductor layer 126, a transmissive conductive layer 130 disposed on the second conductive semiconductor layer 126, a first electrode 142 disposed on the first conductive semiconductor layer 122, a second electrode 146 disposed on the second conductive semiconductor layer 126, and an insulating layer 150.

The light emitting structure 120 includes a first mesa region and a second mesa region, wherein the first mesa region may be disposed on the first conductive semiconductor layer 122, the active layer 124 and the second conductive semiconductor layer 126, and the second mesa region may be disposed only on the first conductive semiconductor layer 122. This is because the first mesa region is formed in a first etching process of exposing the upper surface of the first conductive semiconductor layer 122 in order to form a region in which the first electrode 142 is disposed and the second mesa region is formed in a second etching process of etching the edge of the exposed first conductive semiconductor layer 122 in order to increase the region in which the first electrode 142 is disposed, which will be described later.

Although it is illustrated in FIG. 1 that the side surfaces of the first mesa region and the second mesa region are oriented approximately vertically, they may be tilted at a predetermined angle in practice.

The first conductive semiconductor layer 122 may be made of a Group III-V or Group II-VI compound semiconductor and may be doped with a first conductive dopant. The first conductive semiconductor layer 122 may include a semiconductor material having a formula of $Al_x In_y Ga_{(1-x-y)}N$ ($0 \leq x \leq 1$, $0 \leq y \leq 1$, and $0 \leq x+y \leq 1$), and may be made of at least one of, for example, AlGaN, GaN, InAlGaN, AlGaAs, GaP, GaAs, GaAsP, and AlGaInP.

When the first conductive semiconductor layer 122 is an n-type semiconductor layer, the first conductive dopant may include an n-type dopant, such as Si, Ge, Sn, Se, or Te. The first conductive semiconductor layer 122 may be formed to have a single-layer structure or a multilayer structure, but the disclosure is not limited thereto.

In the first conductive semiconductor layer 122, the second mesa region is formed at one side (the right side in FIG. 1) with respect to the first mesa region, and a height difference is formed at the right side of the second mesa region.

The active layer 124 is disposed on the upper surface of the first conductive semiconductor layer 122 on the first mesa region, and may include one of a single-well structure, a multi-well structure, a single-quantum-well structure, a multi-quantum-well (MQW) structure, a quantum-dot structure, and a quantum-wire structure.

The active layer 124 may have well and barrier layers using compound semiconductor materials of Group III-V elements, and, for example, may have a pair structure made of at least one of AlGaN/AlGaN, InGaN/GaN, InGaN/InGaN, AlGaN/GaN, InAlGaN/GaN, GaAs(InGaAs)/AlGaAs, and GaP(InGaP)/AlGaP, but the disclosure is not limited thereto. The well layer may be made of a material having a lower energy band gap than an energy band gap of the barrier layer.

The second conductive semiconductor layer 126 may be formed on the surface of the active layer 124 using a semiconductor compound. The second conductive semiconductor layer 126 may be made of a Group III-V or Group II-VI compound semiconductor and may be doped with a second conductive dopant. The second conductive semiconductor layer 126 may be made of a semiconductor material having a formula of, for example, $In_xAl_yGa_{1-x-y}N$ ($0 \leq x \leq 1$, $0 \leq y \leq 1$, $0 \leq x+y \leq 1$), and may be made of at least one of AlGaN, GaN, AlInN, AlGaAs, GaP, GaAs, GaAsP, and AlGaInP.

The second conductive semiconductor layer 126 may be doped with a second conductive dopant and, when the second conductive semiconductor layer 126 is a p-type semiconductor layer, the second conductive dopant may be a p-type dopant such as Mg, Zn, Ca, Sr, or Ba. The second conductive semiconductor layer 126 may be formed to have a single-layer structure or a multilayer structure, but the disclosure is not limited thereto.

The transmissive conductive layer 130 made of indium tin oxide (ITO) is formed on the second conductive semiconductor layer 126c, thereby facilitating the current spreading from the second electrode 146 to the second conductive semiconductor layer 126.

The second conductive semiconductor layer 126, the active layer 124, and the first conductive semiconductor layer 122 are mesa-etched in a manner such that etching is carried out from the second conductive semiconductor layer 126 to a portion of the first conductive semiconductor layer 122, thereby exposing the first conductive semiconductor layer 122 so as to secure a region in which the first electrode 146 is formed.

The first electrode 142 and the second electrode 146 may be respectively disposed on the first conductive semiconductor layer 122 and the second conductive semiconductor layer 126.

The insulating layer 150 is formed on the light emitting structure 120 and on the exposed surface of the first electrode 142, a portion of the insulating layer 150 is open on the transmissive conductive layer 130 so as to expose the transmissive conductive layer 130, and the insulating layer 150 may be formed to have a structure having at least two layers, a detailed description of which will be made later.

In the exposed region of the above-mentioned transmissive conductive layer 130, the second electrode 146 may be in direct contact with the transmissive conductive layer.

In FIG. 1, the ratio of the width w0 of the region in which the second electrode 146 is in close contact with the transmissive conductive layer 130 to the sum of widths w1 and w2 of the two opposite side portions of the open region in which the transmissive conductive layer 130 and the insulating layer 150 are in contact with each other may range from 1 to 1 to 3 to 5, wherein w0 may be greater than w1 or w2 and w1 and w2 may be equal to each other. Specifically, the width w0 of the region in which the second electrode 146 is in direct contact with the transmissive conductive layer 130 may be in the range from 10 μm to 30 μm, more specifically 22 μm, and the sum of widths w1 and w2 of the two opposite side portions of the open region, in which the transmissive conductive layer 130 and the insulating layer 150 are in contact with each other, may be in the range from 10 μm to 50 μm, more specifically 30 μm.

As the width w0 of the region in which the second electrode 146 is in direct contact with the transmissive conductive layer 130 is increased, current injection to the second conductive semiconductor layer 126 is increased, but the reflectivity of a DBR structure, which will be described later, may be decreased. As the sum of widths w1 and w2 of the two opposite side portions of the open region, in which the transmissive conductive layer 130 and the insulating layer 150 are in contact with each other, is increased, the reflectivity of the DBR structure is increased, but current injection to the second conductive semiconductor layer 126 may be decreased.

The arrangement relationship among the transmissive conductive layer 130, the second electrode 146 and the insulating layer 150 will be described in detail later with reference to FIG. 6.

The first electrode 142 may be disposed on a portion of the upper surface and the side surface of the first conductive semiconductor layer 122 that forms the second mesa region, and may also extend outward from the side surface of the first conductive semiconductor layer 122.

The first electrode 142 may also be disposed on a portion of the first conductive semiconductor layer 122 that has a height difference with the second mesa region.

Figure 2:
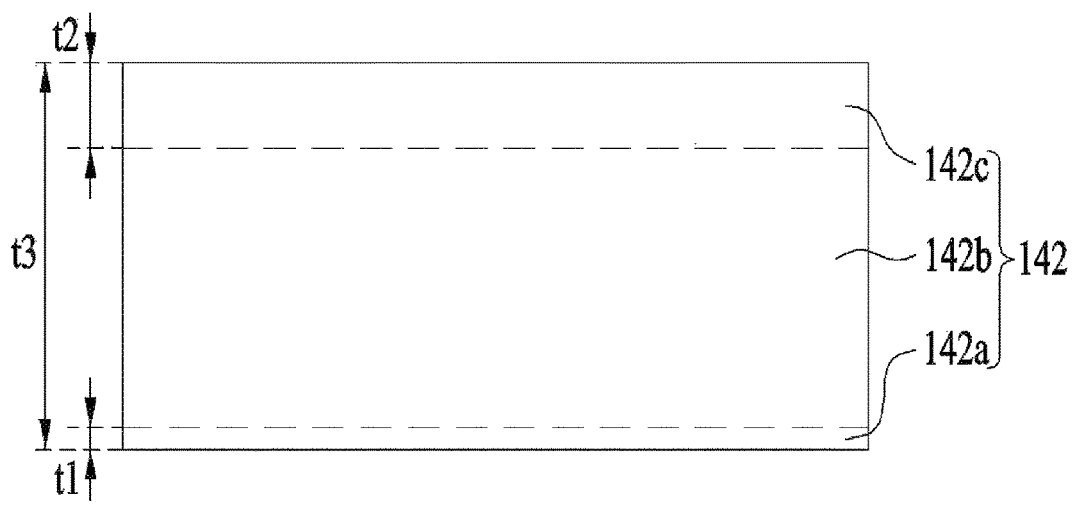
FIG. 2 is a detailed view illustrating the structure of a first electrode

FIG. 2 is a detailed view illustrating the structure of the first electrode.

The first electrode 142 may include an ohmic layer 142a, a reflective layer 142b, and a coupling layer 142c. The ohmic layer 142a may include chrome (Cr) or silver (Ag), the reflective layer 142b may include one of an alloy of platinum (Pt) and gold, an alloy of nickel (Ni) and gold, an alloy of aluminum (Al), platinum (Au) and gold (Au), and an alloy of aluminum (Al), nickel (Ni) and gold (Au), or a combination thereof, and the coupling layer 142c may include titanium (Ti).

The ohmic layer 142a is a thin film for coupling between the first conductive semiconductor layer 122 and the reflective layer 142b, and may have a thickness t1 ranging from 0.5 nm to 3 nm, specifically 1 nm. If the thickness t1 of the ohmic layer 142a is less than 0.5 nm, ohmic contact between the first conductive semiconductor layer 122 and the reflective layer 142b may not be achieved smoothly, and if the thickness t1 of the ohmic layer 142a is greater than 3 nm, light absorption occurs, and thus the light reflectivity of the first electrode 142 may be decreased.

The coupling layer 142c may have a thickness t2 ranging from 10 nm to 200 nm, specifically 50 nm, for coupling between the reflective layer 142b and the insulating layer 150. If the thickness t2 of the coupling layer 142c is less than 10 nm, the coupling between the insulating layer 140 and the reflective layer 142b may not be achieved smoothly, and if the thickness t2 of the coupling layer 142c is greater than 200 nm, the stress of the coupling layer 142c is increased, and thus the quality of the product may be degraded.

The first electrode 142 may have an overall thickness t3 of approximately 1 µm.

Figure 3:
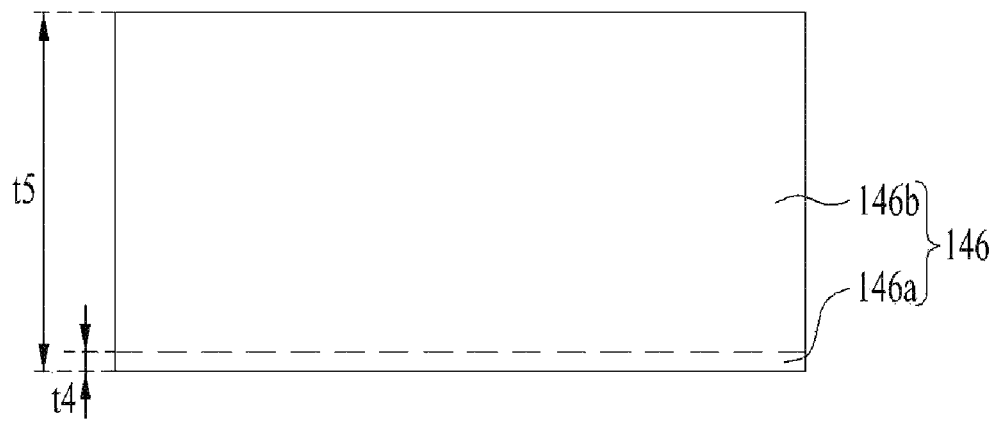
FIG. 3 detailed view illustrating structure of a second electrode.

FIG. 3 is a detailed view illustrating the structure of the second electrode.

The second electrode 146 may include an ohmic layer 146a and a reflective layer 146b. The ohmic layer 146a may be made of chrome, silver or titanium, and is a thin film having a thickness t4 ranging from 0.5 nm to 3 nm, specifically 1 nm, for coupling between the transmissive conductive layer 130 and the reflective layer 146b. If the thickness t4 of the ohmic layer 142a is less than 0.5 nm, ohmic contact between the first conductive semiconductor layer 142 and the reflective layer 142b may not be achieved smoothly, and if the thickness t4 of the ohmic layer 142a is greater than 3 nm, light absorption occurs, and thus the light reflectivity of the first electrode 142 may be decreased.

The reflective layer 146b may include one of an alloy of platinum (Pt) and gold, an alloy of nickel (Ni) and gold, an alloy of aluminum (Al), platinum (Au) and gold (Au), and an alloy of aluminum (Al), nickel (Ni) and gold (Au), or a combination thereof.

The second electrode 146 has an overall thickness t5, which may be equal to the overall thickness t3 of the first electrode 142.

The second electrode 146 is disposed on the open region of the transmissive conductive layer 130, and, as shown in FIG. 1, may overlap the insulating layer 150 in a portion of the region on the transmissive conductive layer 130. In the process of forming the second electrode 146, when the second electrode 146 is formed to be broader than the open region of the transmissive conductive layer 130, it is possible to prevent light leakage.

Further, in the light emitting diode shown in FIG. 1, the insulating layer 150 is disposed in the upper side of the light emitting diode, and the second electrode 146, which is made of metal, is disposed on the open region of the transmissive conductive layer 130. Both the insulating layer 150 and the second electrode 146 serve as reflective films and reflect light in the downward direction in FIG. 1.

Figure 4:
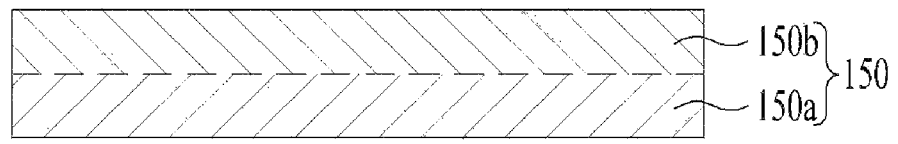
FIG. 4 detailed view illustrating structure of a passivation layer.
Figure 4:
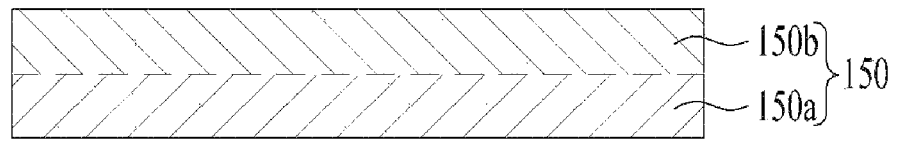

FIG. 4 is a detailed view illustrating the structure of the insulating layer.

In the light emitting diode 100 in FIG. 1, the insulating layer 150 is disposed so as to cover the first mesa etching region and the second mesa etching region, and has an open region formed therein, through which a portion of the transmissive conductive layer 130 is exposed. The insulating layer 150 having this structure may be disposed in the region A, the region B, the region C and the region D in Table 1, which will be described later.

In order to prevent electrical contact between the first conductive semiconductor layer 122 and the second conductive semiconductor layer 126, the insulating layer 150 may be made of an insulative material, specifically a material having a high reflectivity for reflection of the light emitted from the active layer 124, and, for example, may form a DBR structure.

That is, the DBR structure may be formed such that two materials having different refractive indices are alternately arranged several times to tens of times, and FIG. 4 illustrates that first layers 150a and second layers 150b are alternately arranged.

The first layer 150a and the second layer 150b may be made of, for example, $TiO_2$ and $SiO_2$ or $Ta_2O_5$ and $SiO_2$.

In the case in which the first layer 150a and the second layer 150b are made of, for example, $TiO_2$ and $SiO_2$, three first layers 150a and three second layers 150b may be alternately arranged, wherein the thicknesses of the first layers 150a may be in the range from 0.70 nm to 0.90 nm, specifically 0.75 nm, 0.82 nm and 0.75 nm, respectively, and the thicknesses of the second layers 150b may be in the range from 0.35 nm to 0.55 nm, specifically 0.50 nm, 0.43 nm and 0.50 nm, respectively.

The insulating layer 150 is disposed on the first electrode 142 and the exposed surface of the light emitting structure 120, and may be open so that only a portion of the transmissive conductive layer 130 is exposed therethrough. Therefore, in the first mesa etching region in FIG. 1, at least portions of the second conductive semiconductor layer 126, the insulating layer 150 and the second electrode 146 overlap each other in the periphery of the open region of the transmissive conductive layer 130.

In the light emitting diode 100 having the above-described structure, the light, which is emitted from the active layer 124 in the upward and lateral directions in FIG. 1, is reflected by the first electrode 142, the second electrode 146 and the insulating layer 150, and is therefore directed in the downward direction in FIG. 1.

FIGS. 5A to 5J are views illustrating a process of manufacturing the light emitting diode. A plurality of light emitting diodes is manufactured on a wafer-level substrate in a single process; however, only one light emitting diode is illustrated in some drawings for convenience of understanding.

Figure 5A:
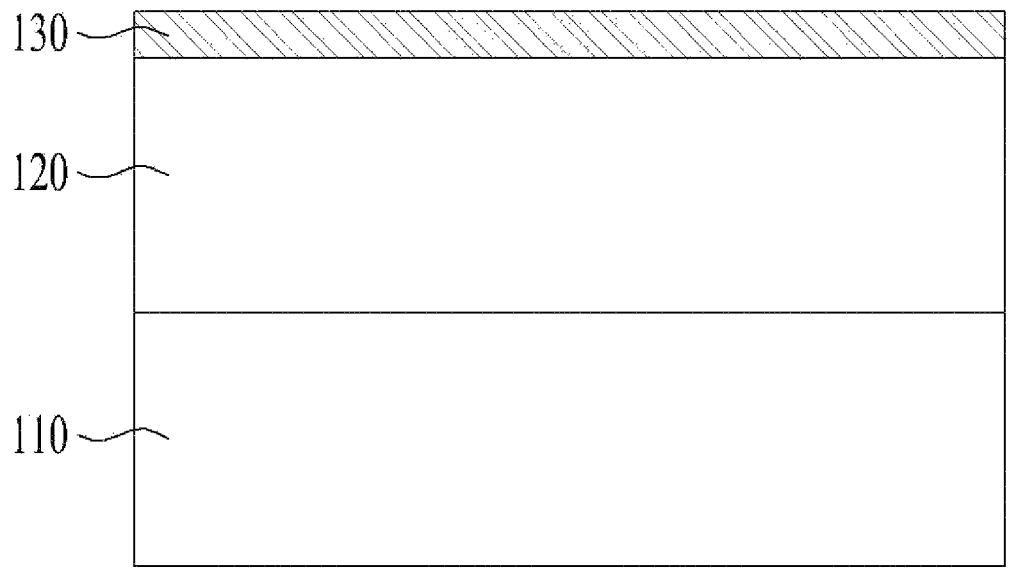
FIGS. 5A to 5J are views illustrating a process of manufacturing emitting diode.

As shown in FIG. 5A, the light emitting structure 120 and the transmissive conductive layer 130 are grown on the substrate 110.

The substrate 110 may be a conductive substrate or an insulating substrate, and, for example, may be formed of at least one of sapphire ($Al_2O_3$), $SiO_2$, SiC, Si, GaAs, GaN, ZnO, GaP, InP, Ge, and $Ga_2O_3$.

When the light emitting structure 120 is grown on the substrate 110 formed of sapphire, because the lattice mismatch between the light emitting structure 120 formed of a gallium nitride-based material and the substrate 110 is great and the difference in coefficients of thermal expansion therebetween is great, dislocation, melt-back, cracks, pits, surface morphology defects and other causes of deterioration of crystallinity may occur, and therefore, a buffer layer (not shown) formed of AlN may be formed.

The light emitting structure 120 including the first conductive semiconductor layer, the active layer and the second conductive semiconductor layer may be formed through, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), etc., but the disclosure is not limited thereto.

The transmissive conductive layer 130 formed of ITO may be grown to a thickness of, for example, 40 nm. The thickness of the substrate 110 may be several times to several hundred times the thicknesses of the light emitting structure 120 and the transmissive conductive layer 130, but the substrate 110 is illustrated at a reduced thickness for convenience of explanation.

Figure 5B:
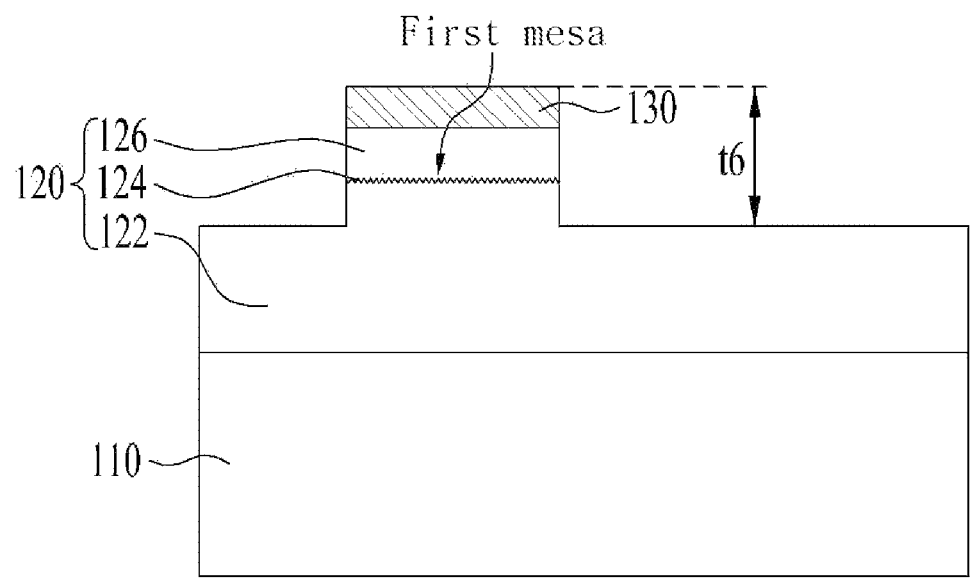

Subsequently, as shown in FIG. 5B, a portion of the upper surface of the first conductive semiconductor layer 122 is exposed by executing first etching of a portion of the light emitting structure 120. In this case, the thickness t6 of the first-etched portion of the light emitting structure 120 may be about 1 μm, and the active layer 124 and the second conductive semiconductor layer 126 may be removed from the region other than the first mesa region.

Figure 5C:
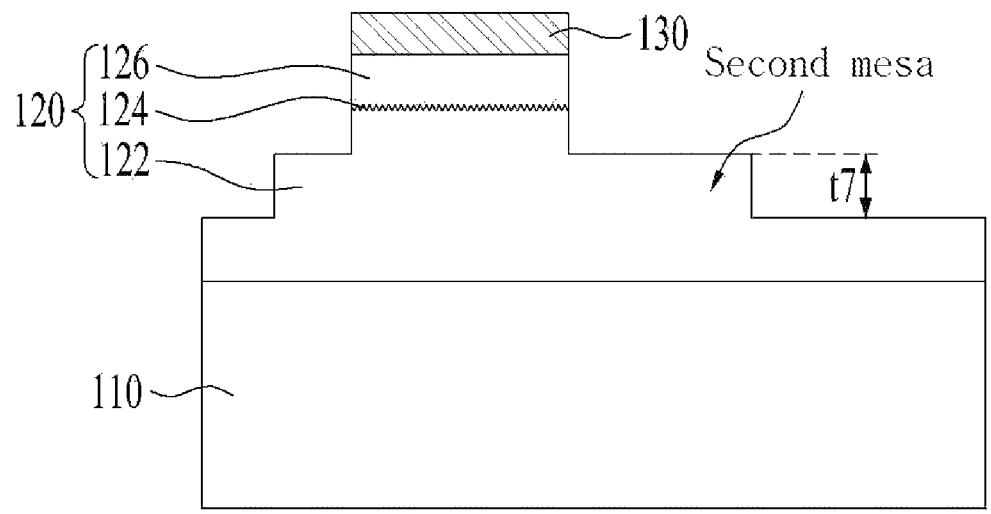

Subsequently, as shown in FIG. 5C, a second etching process is executed with respect to a portion of the first conductive semiconductor layer 122 exposed by the first etching process, and the thickness t7 of the region of the first conductive semiconductor layer 122 that is removed through the second etching process may be about 2 μm. Further, the first conductive semiconductor layer 122 may be exposed in the upward direction of the second mesa region.

Figure 5D:
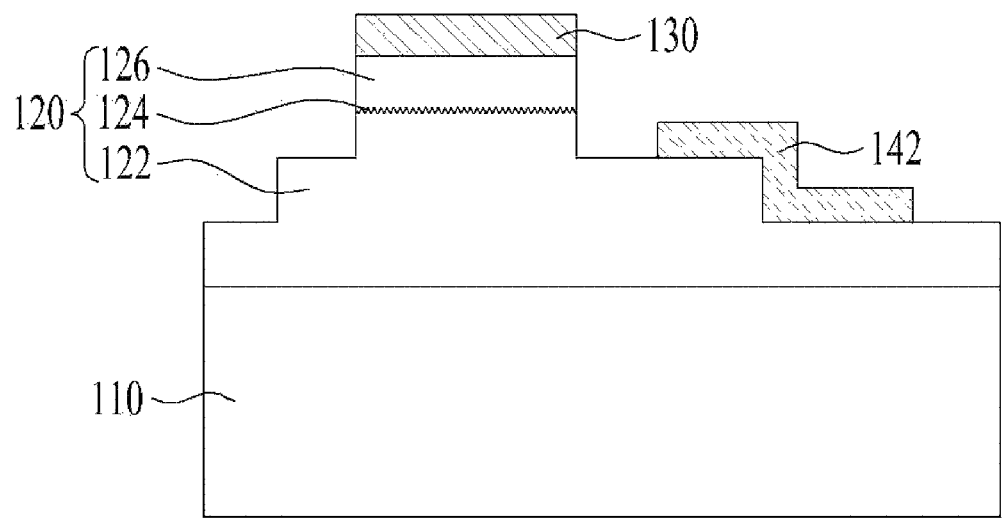

Subsequently, as shown in FIG. 5D, the first electrode 142 may be formed on a portion of the upper surface and the side surface of the first conductive semiconductor layer 122 forming the second mesa region and a portion of the first conductive semiconductor layer 122 that has a height difference with the second mesa region.

The first electrode 142 has the above-described structure, and is spaced apart from the side surface of the light emitting structure 120 in the first mesa region while forming a predetermined region therebetween, in which the insulating layer 150 is disposed. For example, the first electrode 142 may be formed such that an ohmic layer is formed of Ti, which is grown to a thickness of 50 nm, a reflective layer is formed of Ni and Au, which are respectively grown to thicknesses of 50 nm and 900 nm, and a coupling layer is formed of Ti, which is grown to a thickness of 50 nm.

Figure 5E:
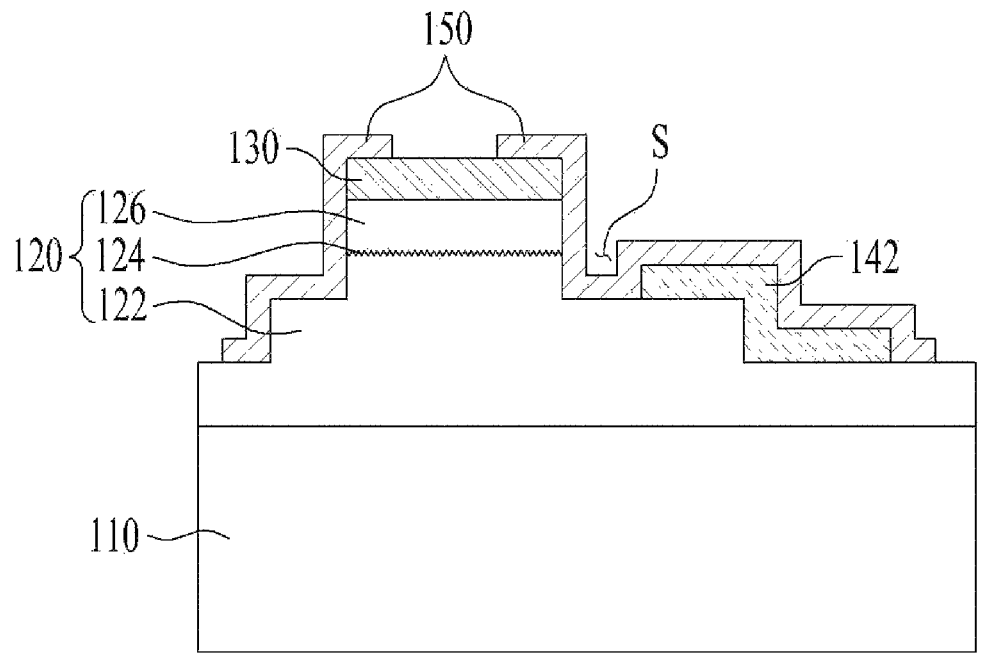

Subsequently, as shown in FIG. 5E, the insulating layer 150 may be grown on the first electrode 142, the transmissive conductive layer 130 and the exposed surface of the light emitting structure 120 through a deposition process, and the insulating layer 150 may be formed to have the above-mentioned DBR structure and may have a thickness of, for example, 300 nm.

As described above, in the second mesa region, the first electrode 142 is disposed only on a portion of the upper surface of the first conductive semiconductor layer 122, and thus the insulating layer 150 may be formed so as to have a stepped region s on the second mesa region.

Further, the insulating layer 150 may be disposed on the peripheral region of the transmissive conductive layer 130 on the first mesa region so as to expose the center region of the transmissive conductive layer 130.

Figure 5F:
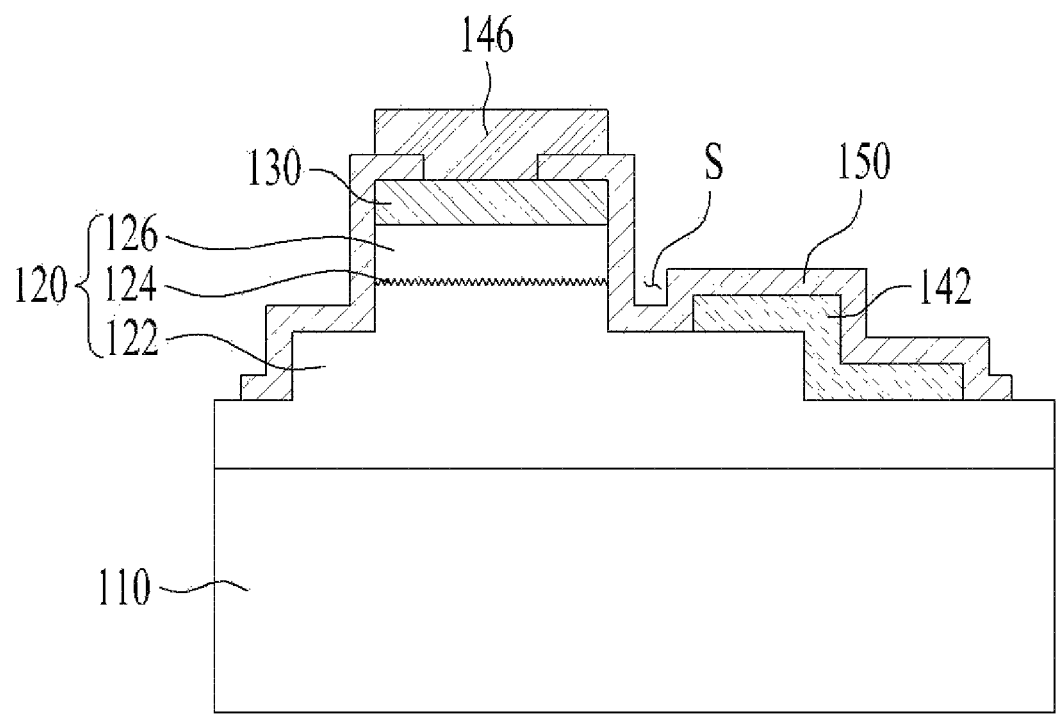

Subsequently, as shown in FIG. 5F, the second electrode 146 may be grown on the exposed center region of the transmissive conductive layer 130. For example, the second electrode 146 may be formed such that an ohmic layer is formed of Ti, which is grown to a thickness of 50 nm, and a reflective layer is formed of Ni and Au, which are respectively grown to thicknesses of 50 nm and 900 nm.

Figure 5G:
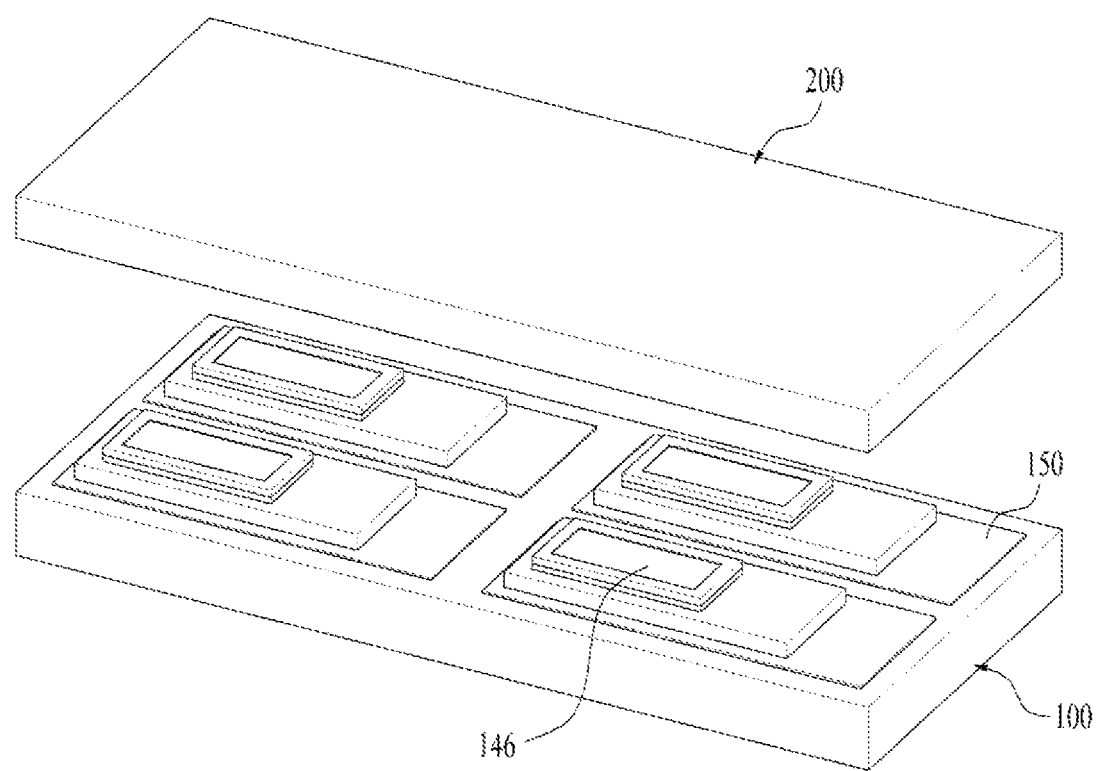

Subsequently, as shown in FIG. 5G, the second electrode 146 is connected to a circuit board 200 by bonding the circuit board 200 to the light emitting diode array. An anisotropic conductive film (ACF), which will be described later, may be used for electrical coupling between the second electrode 146 and the circuit board. Although not illustrated in FIG. 5G, the first electrode may be disposed under the insulating layer 150.

Figure 5H:
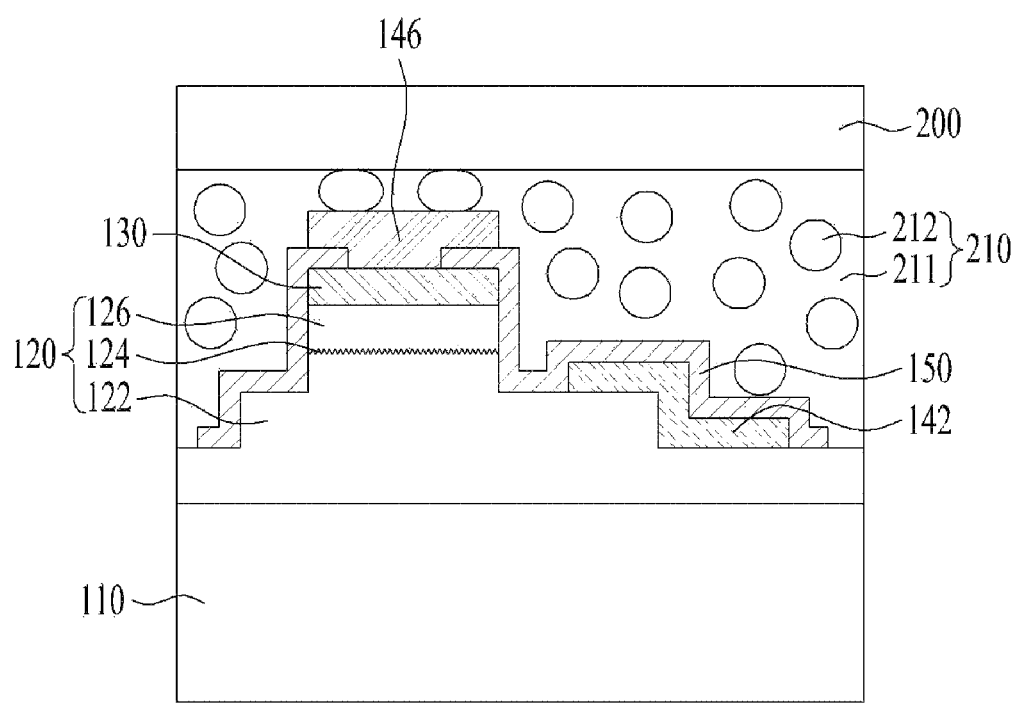

As shown in FIG. 5H, an ACF 210 is formed such that conductive balls 212 are provided in a base material 211, wherein, if heat and pressure are applied thereto, the base material 211 is compressed so that the light emitting diode 100 and the circuit board 200 are coupled to each other, and at this time, the conductive balls 212 may electrically connect the second electrode 146 of the light emitting diode 200 to the circuit board 200.

Figure 5I:
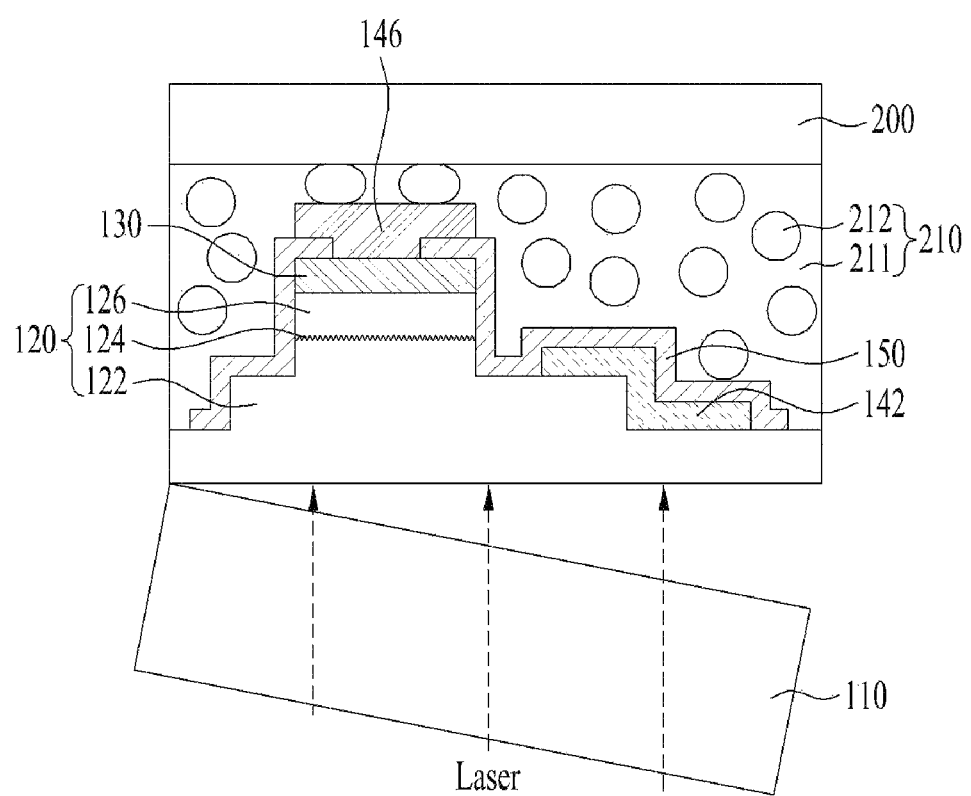

Subsequently, as shown in FIG. 5I, the substrate 110 and a portion of the first conductive semiconductor layer 122 are removed. At this time, a laser lift-off (LLO) method may be used to remove the substrate; however, a dry-etching method or a wet-etching method may alternatively be used.

For example, in the case of the laser lift-off method, when an excimer laser beam having a designated wavelength is focused and radiated in the direction of the substrate 110, heat energy may be concentrated on the interface between the substrate 110 and the light emitting structure 120, and the interface may be separated into gallium and nitrogen molecules, and thus the substrate 110 may be momentarily removed from the light emitting structure in a region through which the laser beam passes.

Figure 5J:
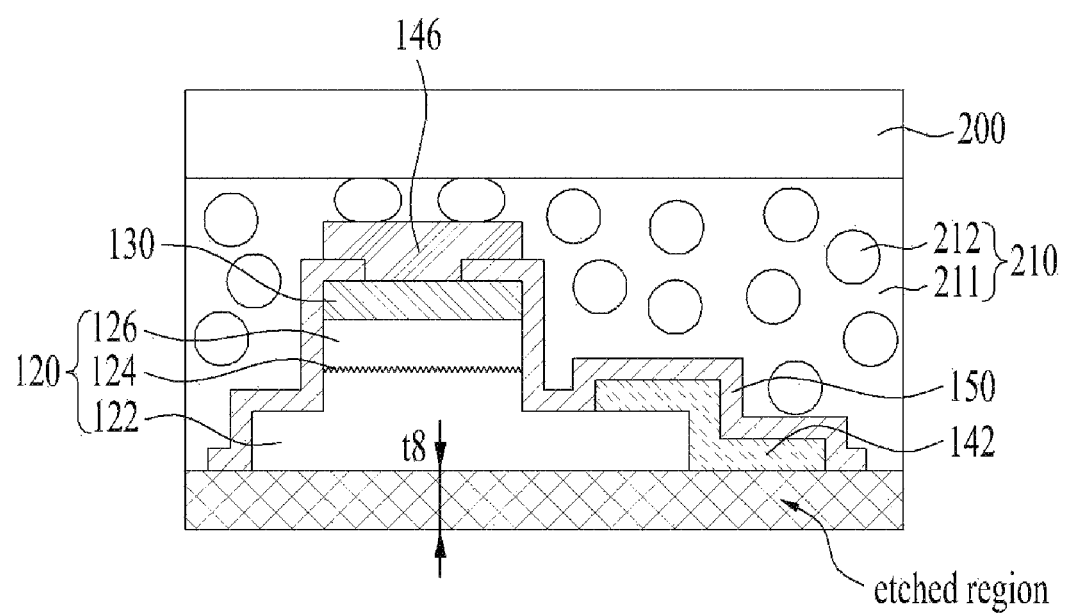

Subsequently, as shown in FIG. 5J, a portion of the first conductive semiconductor layer 122 may be removed through an etching method until the first electrode 142 is exposed, and the thickness t8 of the removed portion of the first conductive semiconductor layer 122 may range, for example, from 2 μm to 3 μm.

Subsequently, when the first electrode 142 of each of the light emitting diodes is connected to the circuit board 200, the formation of the light emitting diode array, in which a plurality of light emitting diodes 100 is connected to the circuit board, is completed. In the light emitting diode array, the first electrodes 142 and the second electrodes 146 of the plurality of light emitting diodes 100 may be respectively connected to the circuit board 200.

Although it is illustrated in FIG. 5J that the second electrode 146 of the light emitting diode 100 is connected to the upper circuit board 200 through the ACF 210 and the first electrode 142 is exposed in the downward direction, the first electrodes 142 of the neighboring light emitting diodes 200 may be connected to each other using a separate single wiring structure in the lower side of the light emitting diode 100, and may then be connected to the circuit board 200.

The height of the light emitting diode array, excluding the circuit board, may be several micrometers, the horizontal and vertical lengths of one light emitting diode may be less than 100 μm, and a plurality of light emitting diodes, for example, 400 light emitting diodes and 1080 light emitting diodes, may be respectively arranged in the horizontal direction and the vertical direction, thus forming pixels in various display apparatuses.

Further, when the circuit board is embodied as a flexible printed circuit board (FPCB), it is possible to realize a light emitting diode array capable of being bent by virtue of flexibility of the FPCB that supports the entire light emitting diode array.

Figure 6:
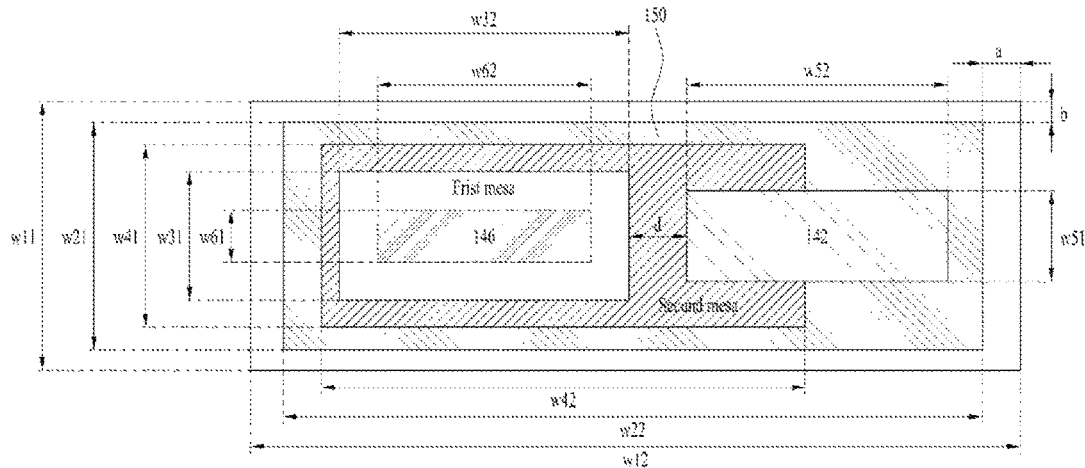
FIG. 6 is a top view of the light emitting diode shown in FIG. 1.

FIG. 6 is a top view of the light emitting diode shown in FIG. 1.

This drawing illustrates the scale of the respective components of the light emitting diode shown in FIG. 1.

The vertical length W21 of the insulating layer 150 may be in the range from 10 μm to 40 μm, specifically 26 μm, and the horizontal length W22 of the insulating layer 150 may be in the range from 10 μm to 90 μm, specifically 73 μm. It is illustrated that a vertical margin a and a horizontal margin b are present at the periphery of the insulating layer 150, in which a may be, for example, 4.5 µm and b may be, for example, 2.0 µm. The vertical length W11 of the entire area including the margins a and b may be in the range from 10 µm to 50 µm, specifically 30 µm, and the horizontal length W12 thereof may be in the range from 10 µm to 100 µm, specifically 82 µm.

After a dicing process to form the respective unit light emitting diodes, the vertical length may be in the range from 10 µm to 30 µm, specifically 20 µm, the horizontal length may be in the range from 10 µm to 70 µm, specifically 50 µm, and a portion of the peripheral region including the insulating layer 150 may be removed from the structure shown in FIG. 6.

The vertical length W31 of the first mesa region may be in the range from 10 µm to 20 µm, specifically 14 µm, the horizontal length W32 of the first mesa region may be in the range from 10 µm to 50 µm, specifically 30 µm, and the shape or the size of the first mesa region may be the same as the shape or the size of the second electrode.

The vertical length W41 and the horizontal length W42 of the second mesa region may be greater than those of the first mesa region, wherein the vertical length W41 of the second mesa region may be in the range from 10 µm to 30 µm, specifically 20 µm, and the horizontal length W42 of the second mesa region may be in the range from 10 µm to 70 µm, specifically 50 µm.

A region, which is defined as having a vertical length W61 and a horizontal length W62 in the first mesa region, may be a region in which the transmissive conductive layer 130 is in contact with the second electrode 146 because the insulating layer 150 is not disposed on the region, wherein the vertical length W61 of the above-mentioned region may be in the range from 2 µm to 10 µm, specifically 6 µm, and the horizontal length W62 of the above-mentioned region may be in the range from 10 µm to 30 µm, specifically 22 µm.

The vertical length W51 of the first electrode 142 may be in the range from 5 µm to 20 µm, specifically 10 µm, and the vertical length W52 of the first electrode 142 may be in the range from 10 µm to 40 µm, specifically 27 µm. The distance d between the first electrode 142 and the first mesa region may be in the range from 2 µm to 10 µm, specifically about 7 µm.

Because the first electrode 142 is actually disposed under the insulating layer 150 disposed in the second mesa region, it may be invisible in the top view of FIG. 6. After the above-mentioned dicing process, the periphery of the second mesa region may be entirely removed, and accordingly, the first electrode 142 may be exposed in the downward direction of the insulating layer 150.

Figure 7A:
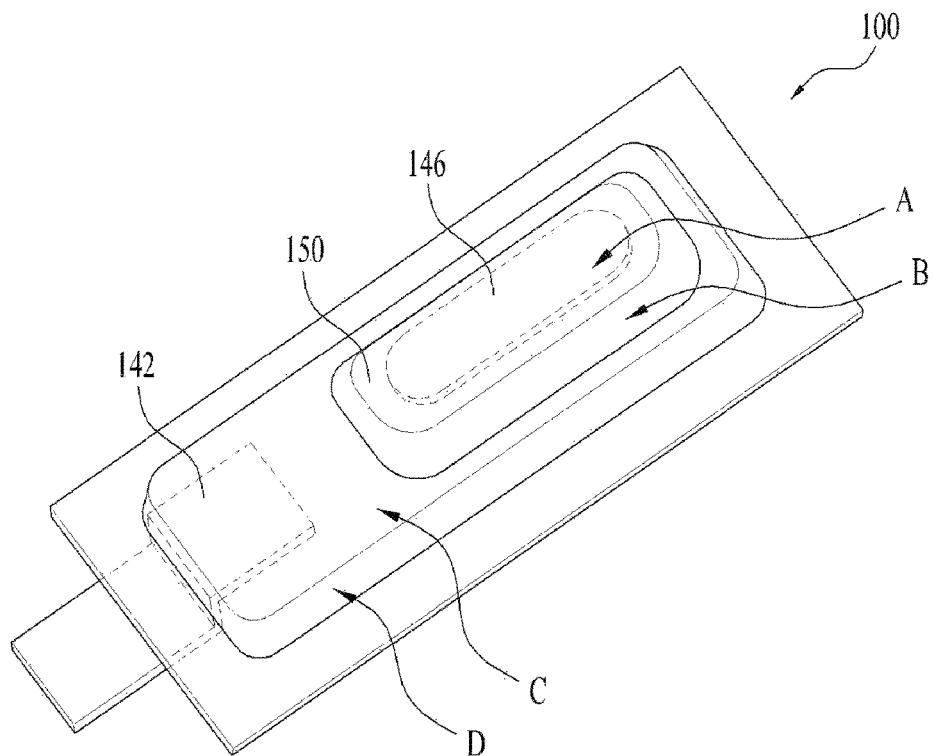
FIGS. 7A and 7B are a perspective view and a side-sectional view of the light emitting diode shown in FIG. 1.
Figure 7B:
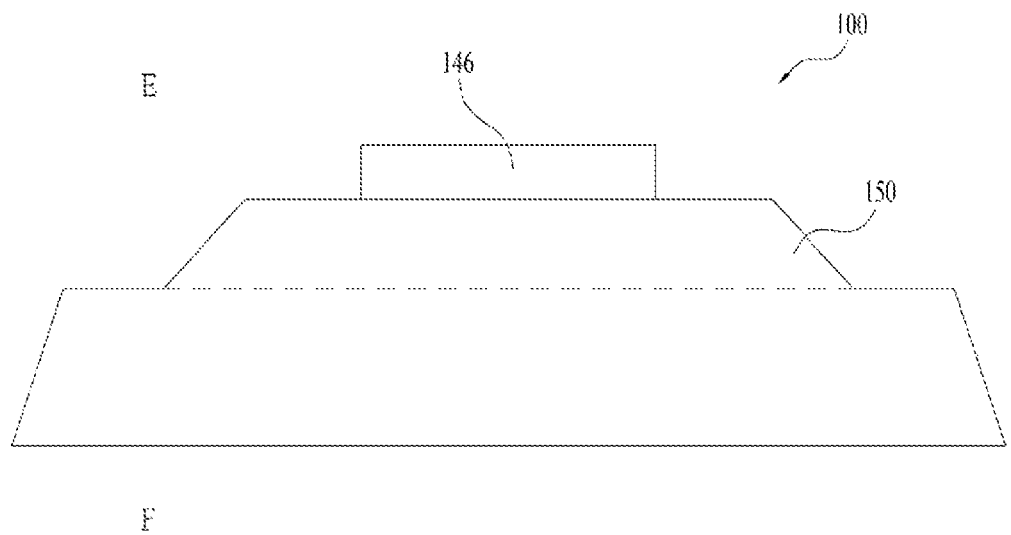

FIGS. 7A and 7B are a perspective view and a side-sectional view of the light emitting diode shown in FIG. 1.

FIGS. 7A and 7B are views for showing the light emitting efficiency of the light emitting diode in accordance with the above-described composition of the insulating layer.

A represents the periphery of the first mesa region, in which the insulating layer and the second electrode are sequentially disposed on the light emitting structure. B represents the side surface of the first mesa region, in which the insulating layer is disposed on the light emitting structure, C represents the upper surface of the second mesa region, in which the insulating layer is disposed on the light emitting structure, D represents the side surface of the second mesa region, in which the insulating layer is disposed on the light emitting structure, E represents the upper region of the light emitting diode, in which, as shown in FIG. 5H, the ACF is disposed, and F represents the lower region of the light emitting structure, in which air is disposed.

Table 1 shows the light emitting efficiency (LEE) in accordance with variation of the compositions of A to F shown in FIGS. 7A and 7B.

TABLE 1

|  | A | B | C | D | E | F | LEE |
|---|---|---|---|---|---|---|---|
| Embodiment | DBR/Cr/Al | DBR | DBR | DBR | ACF | Air | 37.27 |
| Comparative Example 1 | DBR/Cr/Al | DBR/Cr/Al | DBR | DBR | ACF | Air | 35.24 |
| Comparative Example 2 | SiO$_2$/Cr/Al | SiO$_2$ | SiO$_2$ | SiO$_2$ | ACF | Air | 27.60 |
| Comparative Example 3 | SiO$_2$/Cr/Al | SiO$_2$/Cr/Al | SiO$_2$ | SiO$_2$ | ACF | Air | 28.44 |
| Comparative Example 4 | DBR/Cr/Al | DBR | DBR | DBR | Air | Air | 37.89 |
| Comparative Example 5 | DBR/Cr/Al | DBR/Cr/Al | DBR | DBR | Air | Air | 35.59 |
| Comparative Example 6 | SiO$_2$/Cr/Al | SiO$_2$ | SiO$_2$ | SiO$_2$ | Air | Air | 30.47 |
| Comparative Example 7 | SiO$_2$/Cr/Al | SiO$_2$/Cr/Al | SiO$_2$ | SiO$_2$ | Air | Air | 31.21 |

It can be known from Table 1 that the light emitting diode according to the embodiment, which includes A to F having the above compositions, has excellent light emitting efficiency (LEE), and it is noted that the light emitting efficiency of the light emitting diode according to Comparative Example 4 is one measured before bonding of the light emitting diode to the circuit board using the ACF.

As described above, the light emitting diode array may form pixels in various display apparatuses and may be used as a light source of lighting apparatuses. Specifically, when an FPCB is used as the circuit board, it is possible to realize a light emitting diode array capable of being bent by virtue of flexibility of the FPCB, and accordingly, the light emitting diode array may be used as a light source for wearable apparatuses such as, for example, a smart watch.

Figure 8:
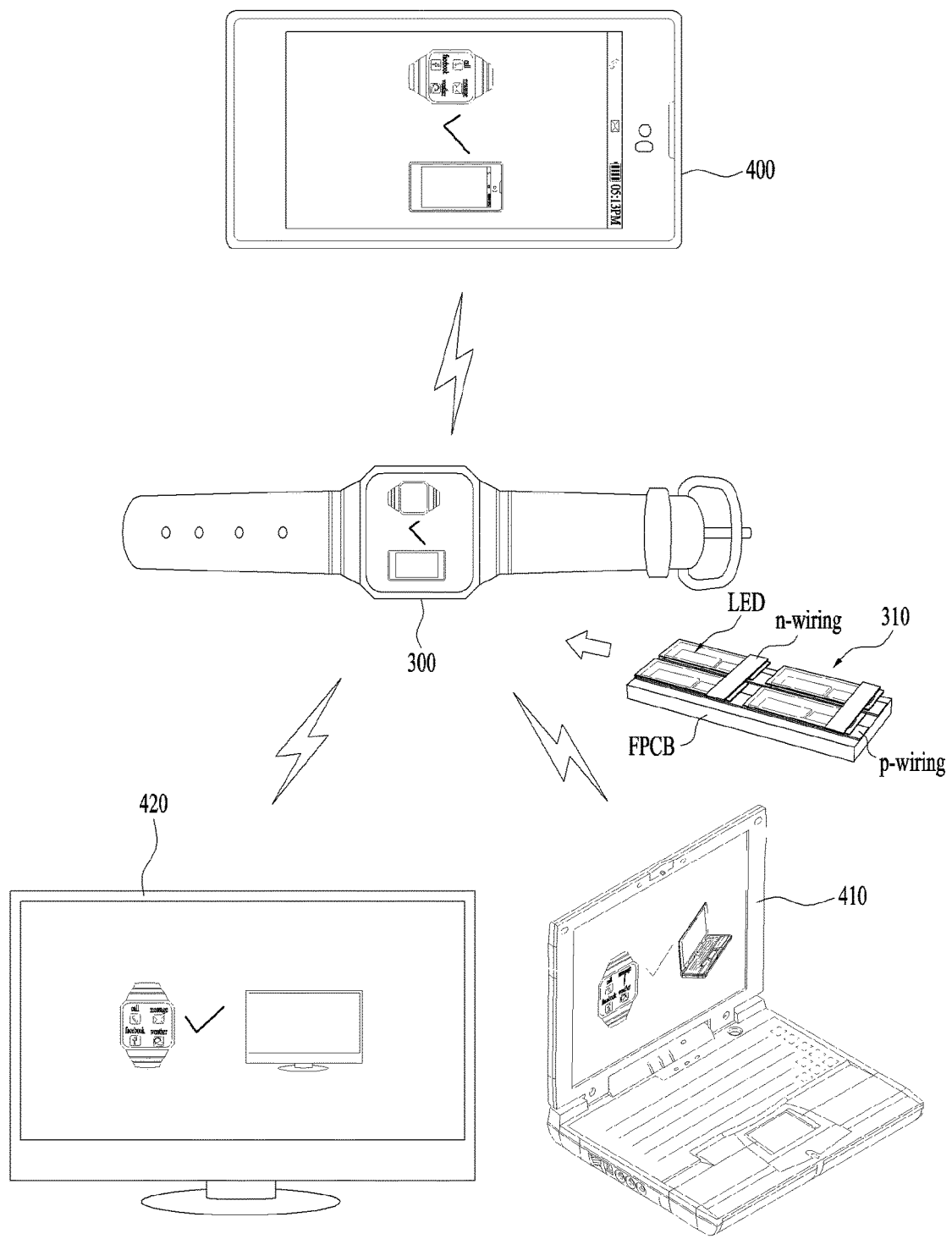
FIG. 8 is a view illustrating an embodiment of a smart watch including a light emitting diode array.

FIG. 8 is a view illustrating an embodiment of a smart watch including the light emitting diode array.

A smart watch 300 may execute pairing with external digital devices, and the external digital devices may be digital devices that may connect to the smart watch 300 for communication therewith, for example, a smart phone 400, a laptop computer 410, an internet protocol television (IPTV) 420, etc.

The above-mentioned light emitting diode array 310 may be used as a light source of the smart watch 300, the smart watch 300 may be wearable on a user's wrist by virtue of flexibility of the FPCB, and the light emitting diode array 310 may implement fine pixels due to the fine size of the light emitting diode.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The light emitting diode and the light emitting diode array including the same according to the embodiment are applicable to display apparatuses, specifically, flexible wearable apparatuses such as, for example, a smart watch.

The invention claimed is:
1. A light emitting diode comprising:
a light emitting structure including a first conductive semiconductor layer, an active layer disposed on the first conductive semiconductor layer, and a second conductive semiconductor layer disposed on the active layer;
a first electrode disposed on a portion of the first conductive semiconductor layer;
an insulating layer disposed on the first electrode, the first conductive semiconductor layer, the active layer and a portion of the second conductive semiconductor layer, the insulating layer having a DBR structure; and
a second electrode disposed on the second conductive semiconductor layer,
wherein the light emitting structure includes a first mesa region, and the first conductive semiconductor layer includes a second mesa region,
wherein the first electrode is disposed on a side surface of the first conductive semiconductor layer in the second mesa region,
wherein the first electrode includes a first portion, a second portion and a third portion,
wherein a lower surface of the first portion directly contacts an upper surface of the first conductive semiconductor layer in the second mesa region,
wherein a side surface of the second portion directly contacts a side surface of the first conductive semiconductor layer in the second mesa region,
wherein the third portion extends outwardly from a lower part of the second portion, and
wherein a lower surface of the third portion is disposed on a same line as a lower surface of the first conductive semiconductor layer.

2. The light emitting diode according to claim 1, wherein an open region through which the second conductive semiconductor layer is exposed is disposed on the first mesa region, and at least a portion of the second electrode is disposed on the open region.

3. The light emitting diode according to claim 2, wherein at least portions of the second conductive semiconductor layer, the insulating layer and the second electrode overlap each other in a periphery of the open region on the first mesa region.

4. The light emitting diode according to claim 1, wherein the DBR structure is formed such that an arrangement of $TiO_2$ and $SiO_2$ or an arrangement of $Ta_2O_5$ and $SiO_2$ is repeated at least twice.

5. The light emitting diode according to claim 1, wherein the first electrode includes an ohmic layer, a reflective layer, and a coupling layer disposed on the reflective layer.

6. The light emitting diode according to claim 5, wherein the coupling layer includes titanium (Ti).

7. The light emitting diode according to claim 1, wherein the second electrode includes an ohmic layer and a reflective layer.

8. The light emitting diode according to claim 7, wherein the ohmic layer of the second electrode includes chrome (Cr), silver (Ag) or titanium (Ti).

9. The light emitting diode according to claim 7, wherein the ohmic layer of the second electrode has a thickness of 1 nm or less.

10. The light emitting diode according to claim 7, wherein the reflective layer includes an alloy of platinum (Pt) and gold (Au), an alloy of nickel (Ni) and gold (Au), an alloy of aluminum (Al), platinum (Au) and gold (Au), or an alloy of aluminum (Al), nickel (Ni) and gold (Au).

11. A light emitting diode comprising:
a light emitting structure including a first conductive semiconductor layer, an active layer disposed on the first conductive semiconductor layer, a second conductive semiconductor layer disposed on the active layer, a first mesa region, and a second mesa region formed in the first conductive semiconductor layer;
a first electrode disposed on the second mesa region;
a second electrode disposed on the first mesa region; and
an insulating layer disposed between the first electrode and the second electrode, the insulating layer having a DBR structure,
wherein the first electrode includes a first surface and a second surface, the first surface being in contact with the insulating layer and the second surface being opposite the first surface and having an open portion, and
the second electrode includes a first surface and a second surface, the first surface having an open portion and the second surface being opposite the first surface and being in contact with the light emitting structure,
wherein the first electrode includes a first portion, a second portion and a third portion,
wherein a lower surface of the first portion directly contacts an upper surface of the first conductive semiconductor layer in the second mesa region,
wherein a side surface of the second portion directly contacts a side surface of the first conductive semiconductor layer in the second mesa region,
wherein the third portion extends outwardly from a lower part of the second portion, and
wherein a lower surface of the third portion is disposed on a same line as a lower surface of the first conductive semiconductor layer.

12. The light emitting diode according to claim 11, wherein the insulating layer is disposed on the first surface of the first electrode, the first conductive semiconductor layer, the active layer and a portion of the second conductive semiconductor layer.

13. A light emitting diode array comprising:
a circuit board;
a plurality of light emitting diodes, each including:
a light emitting structure disposed on the circuit board and including a first conductive semiconductor layer, an active layer disposed on the first conductive semiconductor layer, and a second conductive semiconductor layer disposed on the active layer;
a first electrode disposed on a portion of the first conductive semiconductor layer; an insulating layer disposed on the first electrode, the first conductive semiconductor layer, the active layer and a portion of the second conductive semiconductor layer, the insulating layer having a DBR structure; and
a second electrode disposed on the second conductive semiconductor layer, and
an anisotropic conductive film (ACF) disposed between the circuit board and the light emitting diodes,
wherein the ACF includes a base material and conductive balls provided in the base material, and the conductive balls are in contact with the circuit board and the second electrode,
wherein the first electrode includes a first surface and a second surface, the first surface of the first electrode being in contact with the insulating layer and the second surface of the first electrode being opposite the first surface and having an open portion, the second electrode includes a first surface and a second surface, the first surface of the second electrode having an open portion and the second surface of the second electrode being opposite the first surface and being in contact with the light emitting structure, and wherein the first electrode of each of the light emitting diodes is connected to first electrodes of other light emitting diodes using a single wiring structure in a region oriented opposite the circuit board.

14. The light emitting diode array according to claim 13, wherein the light emitting structure includes a first mesa region, the first conductive semiconductor layer includes a second mesa region, and the first electrode is disposed on the first conductive semiconductor layer in the second mesa region.

15. The light emitting diode array according to claim 14, wherein the first electrode is disposed on a side surface of the first conductive semiconductor layer in the second mesa region and extends to a periphery of the second mesa region.

16. The light emitting diode array according to claim 14, wherein the first electrode includes a first portion, and a lower surface of the first portion directly contacts an upper surface of the first conductive semiconductor layer in the second mesa region.

17. The light emitting diode array according to claim 16, wherein the first electrode includes a second portion, and a side surface of the second portion directly contacts a side surface of the first conductive semiconductor layer in the second mesa region.

18. The light emitting diode array according to claim 17, wherein the first electrode includes a third portion, and the third portion extends outwardly from a lower part of the second portion.

19. The light emitting diode array according to claim 18, wherein a lower surface of the third portion is disposed on a same line as a lower surface of the first conductive semiconductor layer.

* * * * *